United States Patent
Hsiao et al.

(10) Patent No.: US 6,872,629 B2
(45) Date of Patent: Mar. 29, 2005

(54) METHOD OF FORMING A MEMORY CELL WITH A SINGLE SIDED BURIED STRAP

(75) Inventors: Chih-Yuan Hsiao, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/722,647

(22) Filed: Nov. 26, 2003

(65) Prior Publication Data

US 2004/0248364 A1 Dec. 9, 2004

(30) Foreign Application Priority Data

Jun. 5, 2003 (TW) .................................. 92115186 A

(51) Int. Cl.[7] .................. H01L 21/20; H01L 21/8242
(52) U.S. Cl. .................. 438/386; 438/389; 438/243; 438/246
(58) Field of Search .................. 438/386, 389, 438/391–392, 243, 246, 248–249

(56) References Cited

U.S. PATENT DOCUMENTS

| | | | |
|---|---|---|---|
| 5,519,236 A | | 5/1996 | Ozaki |
| 6,008,104 A | * | 12/1999 | Schrems ............... 438/386 |
| 6,190,988 B1 | * | 2/2001 | Furukawa et al. .......... 438/386 |
| 6,326,261 B1 | * | 12/2001 | Tsang et al. ............... 438/243 |
| 6,339,241 B1 | * | 1/2002 | Mandelman et al. ....... 257/301 |
| 6,432,774 B2 | | 8/2002 | Heo et al. |
| 6,440,793 B1 | * | 8/2002 | Divakaruni et al. ........ 438/243 |
| 6,551,875 B2 | * | 4/2003 | Tsao ........................... 438/246 |
| 2004/0029343 A1 | * | 2/2004 | Seidi et al. ................. 438/243 |

OTHER PUBLICATIONS

Debra S. Woolsey, 'Enhanced discrete DMOS power trench gate oxide growth', *Solid State Technology*, vol. 45, Issue 8 Aug. 2002, Pennwell Publishing, US.

* cited by examiner

Primary Examiner—Michael Trinh
(74) Attorney, Agent, or Firm—Quintero Law Office

(57) ABSTRACT

A method of forming a memory cell with a single sided buried strap. A collar oxide layer is formed on the sidewall of a trench. A conductive layer fills the trench. The conductive layer and the collar oxide layer are partially removed to form an opening having first and second sidewalls. The remaining collar oxide layer is lower than the remaining conductive layer. An angle implantation with F ions is performed on the first sidewall. A thermal oxidation process is performed to form a first oxide layer on the first sidewall and a second oxide layer on the second sidewall. The first oxide layer is thicker than the second oxide layer. The second oxide layer is removed to expose the second sidewall. A buried strap is formed at the bottom of the opening, insulated from the first sidewall by the first oxide layer.

20 Claims, 9 Drawing Sheets

US 6,872,629 B2

METHOD OF FORMING A MEMORY CELL WITH A SINGLE SIDED BURIED STRAP

BACKGROUND OF THE INVENTION

1. Field of the Invention

The present invention relates to a method of fabricating a memory cell with a transistor, and more particularly, to a method of forming a dynamic random access memory (DRAM) cell having a single sided buried strap.

2. Description of the Related Art

A DRAM cell comprises a metal-oxide-semiconductor field effect transistor (MOSFET) and a capacitor formed in a semiconductor silicon substrate. There is an electrical contact between the drain of a MOSFET and the bottom storage electrodes of the adjacent capacitor, which forms a memory cell of the DRAM device. A large number of memory cells make up the cell arrays which combine with the peripheral circuit to produce DRAMs.

In recent years, MOSFET size has been continuously reduced so that the packing density of DRAM devices has increased considerably. For example, new techniques for manufacturing extremely small transistor elements have been developed for 1 Giga bit DRAMs and beyond. One of the methods of increasing integration is to form a three-dimensional transistor structure, instead of the commonly used planar-type transistor.

FIGS. 1A through 1H are schematic sectional views showing a partially fabricated integrated circuit structure at successive stages in forming a transistor of a DRAM cell of the prior art.

In FIG. 1A, a patterned pad layer 110 is formed on a silicon substrate 100. The pad layer 110 can comprise an oxide pad layer (not shown) and a pad nitride layer (not shown). Using the pad layer 110 as a mask, a deep trench 112 is then defined in the substrate 100 by photolithography and etching. A trench capacitor (not shown) is formed in the lower portion of the deep trench 112 by a conventional process.

In FIG. 1B, a collar oxide layer 114 is formed on the sidewall of the upper portion of the deep trench 112. The collar oxide layer 114 is located above the trench capacitor (not shown). A polysilicon layer 116 is then formed filling the deep trench 112.

In FIG. 1C, the polysilicon layer 116 is etched back until the surface of a remaining polysilicon layer 116' is lower than the surface of the substrate 100.

In FIG. 1D, by performing an etch-back process, the collar oxide layer 114 over the top surface of the remaining polysilicon layer 116' is over-etched until the top surface of a remaining collar oxide layer 114' is lower than that of the remaining polysilicon layer 116'. Thus, an opening 118 is formed.

In FIG. 1E, a doped polysilicon layer (e.g. a P or As doped polysilicon layer, not shown) is deposited on the pad layer 110 and fills the opening 118. Then, the doped polysilicon layer (not shown) is etched back to form a buried strap 120 at the bottom of the opening 118.

In FIG. 1F, an insulating layer (not shown) is formed to fill the opening 118. Then, the insulating layer (not shown) is partially etched back to form an insulating layer 122 on the buried strap 120.

In FIG. 1G, a gate oxide layer 124 is formed on the sidewall of the opening 118 by thermal oxidation. A gate 126 is then formed on the insulating layer 122.

In FIG. 1H, an insulating spacer 128 is formed on the sidewall of the upper portion of the opening 118. The opening 118 is then filled with conductive material to form a conductive layer 130. Next, a shallow trench isolation (STI) 132 is formed in the substrate 100 to define active areas. The pad layer 110 is then removed by CMP (chemical mechanical polishing) to obtain a smooth substrate 100 surface.

In FIG. 1H, a word line 134 is formed on the conductive layer 130. A drain region 136 is formed by using the word line 134 as a mask and implanting impurities into the substrate 100. Due to the high temperature during the mentioned manufacturing processes, impurities contained in the buried strap 120 out-diffuse into the substrate 100 to form a source region 138, as show in FIGS. 1G and 1H.

With reference to FIG. 1H, the source region 138 formed by the conventional method is circular, and the distance "d" between adjacent source regions 138, and 138 is shortened when DRAM cells are scaled down. The gap created between adjacent source regions causes a serious leakage problem (also referred to as a buried strap mergence issue), reducing device reliability.

In U.S. Pat. No. 6,432,774, Heo et al disclose a method of fabricating a DRAM cell having a vertical transistor. Though this method can form a memory cell with a single sided source region, the source region of the memory cell nevertheless faces an adjacent memory cell. Thus, the leakage problem occurs when the design rule is below 0.11 µm.

In U.S. Pat. No. 5,519,236, Ozaki discloses a DRAM cell having a vertical transistor. The method removes an oxide layer on one side by photolithography using a photoresist layer as a mask. A memory cell with a single sided source region can thus be formed. Nevertheless, this method suffers from misalignment issue during photolithography, making it unsuitable suitable for use in the narrower trench process.

SUMMARY OF THE INVENTION

An object of the present invention is to provide a method of forming a memory cell having a vertical transistor.

Another object of the present invention is to provide a method of forming a DRAM cell with a single sided buried strap.

In order to achieve these objects, the present invention provides a method of forming a memory cell with a single sided buried strap. A substrate having a trench is provided. A trench capacitor is formed at a lower portion of the trench. A collar insulating layer is formed on a sidewall of an upper portion of the trench. A first conductive layer is formed above the trench capacitor and fills the trench. Part of the first conductive layer and part of the collar insulating layer are removed to form a remaining first conductive layer and a remaining collar insulating layer in an opening, wherein the opening has a first sidewall and a second sidewall, and a top surface of the remaining collar insulating layer is lower than that of the remaining first conductive layer. An angle implantation with fluorine-containing ions is performed on the first sidewall of the opening. A thermal oxidation process is performed to form a first oxide layer on the first sidewall and a second oxide layer on the second sidewall, wherein a thickness of the first oxide layer is greater than that of the second oxide layer. The second oxide layer is removed to expose the second sidewall. A second conductive layer serving as a buried strap is formed at a bottom of the opening, wherein the second conductive layer is insulated from the first sidewall by the first oxide layer.

The present invention improves on the prior art in that the angle implantation with fluorine-containing ions causes the first oxide layer on the first sidewall to be greater than the second oxide layer on the second sidewall. The second oxide layer is removed to expose the second sidewall, the first oxide layer, however, remains on the first sidewall. A single sided buried strap is then formed at the bottom of the opening. Thus, the single sided buried strap is insulated from the first sidewall by the first oxide layer, thereby solving the leakage problem between adjacent source regions. In addition, the present invention is well suited to the 0.11 μm (or below) trench technology, thereby achieving the goal of reduction in IC size and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

An embodiment according to the present invention will be explained with reference to FIGS. 2A~2J.

Figure 1A:
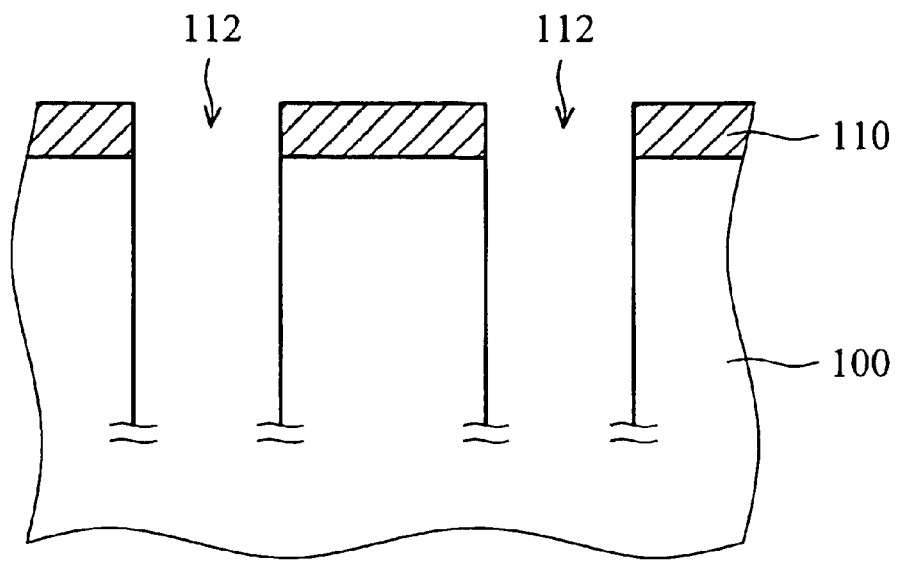
FIGS. 1A~1H are schematic sectional views showing a partially fabricated integrated circuit structure at successive stages in forming a transistor of a DRAM cell of the prior art.
Figure 1B:
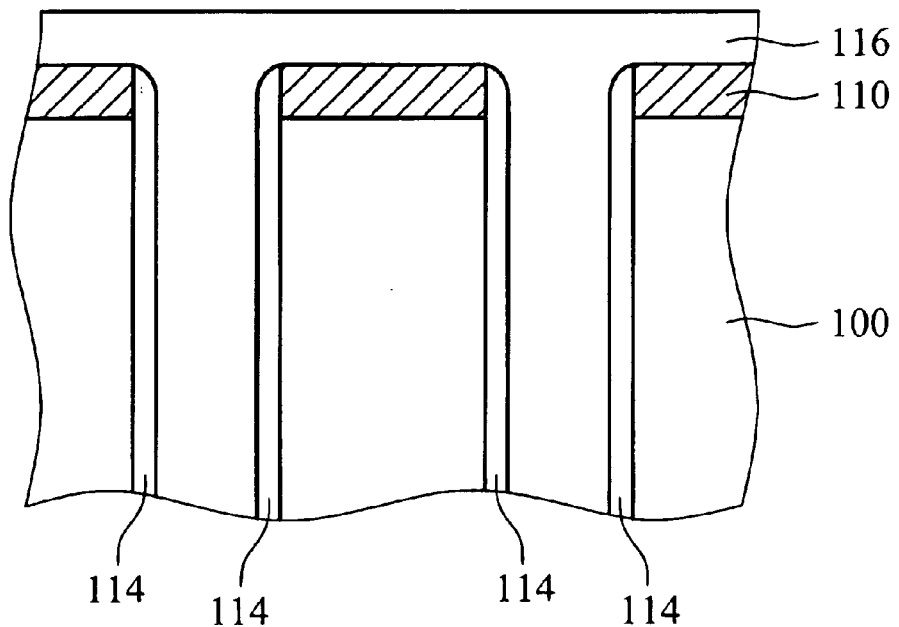
Figure 1C:
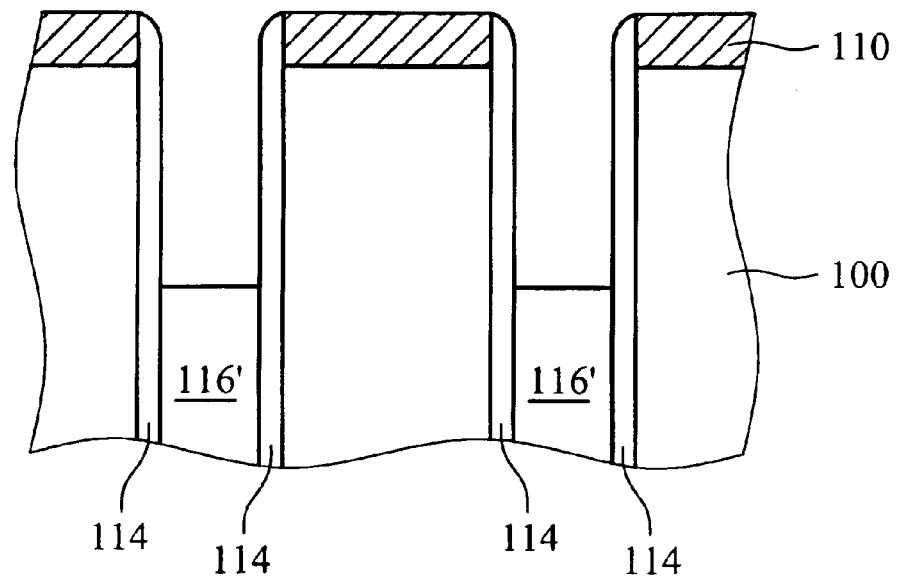
Figure 1D:
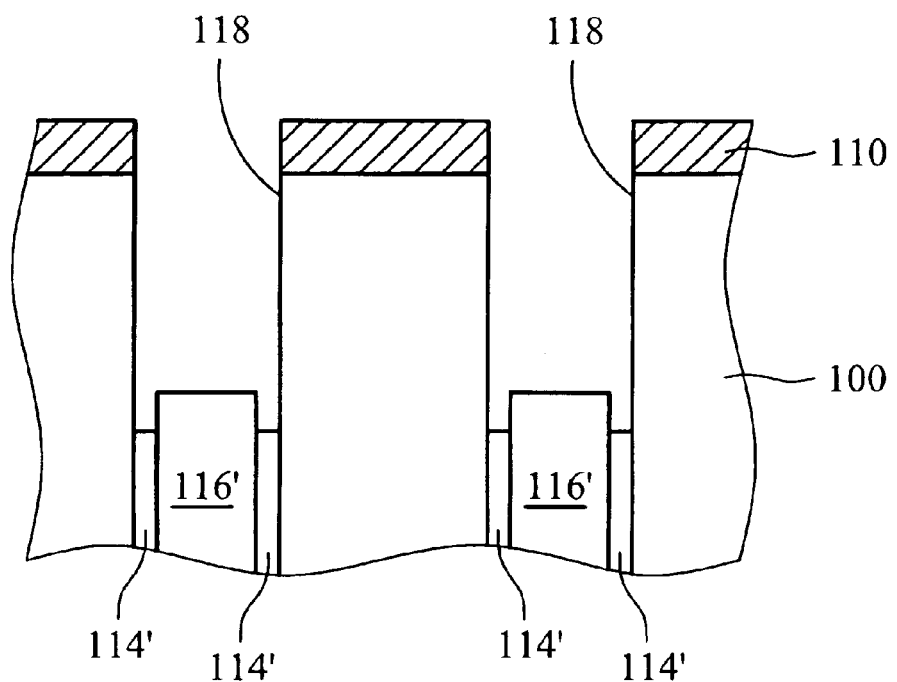
Figure 1E:
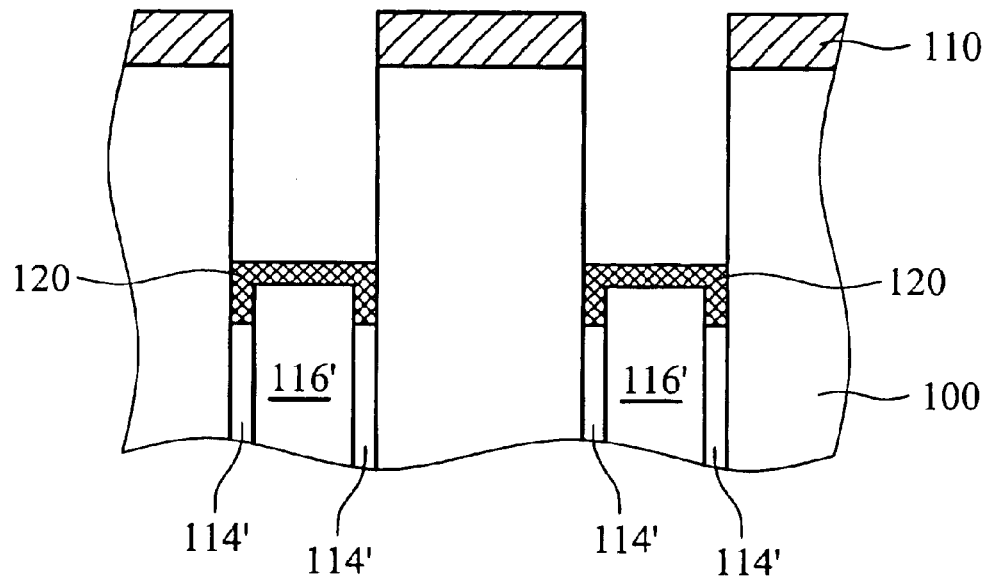
Figure 1F:
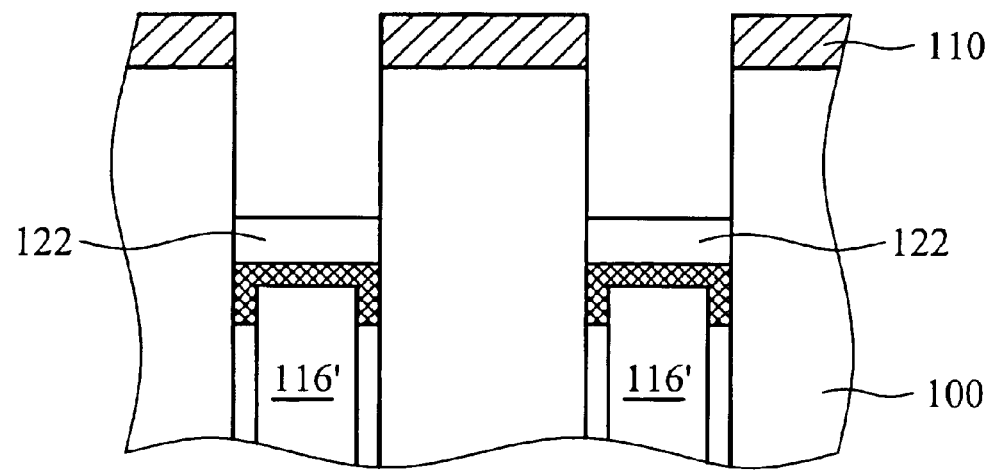
Figure 1G:
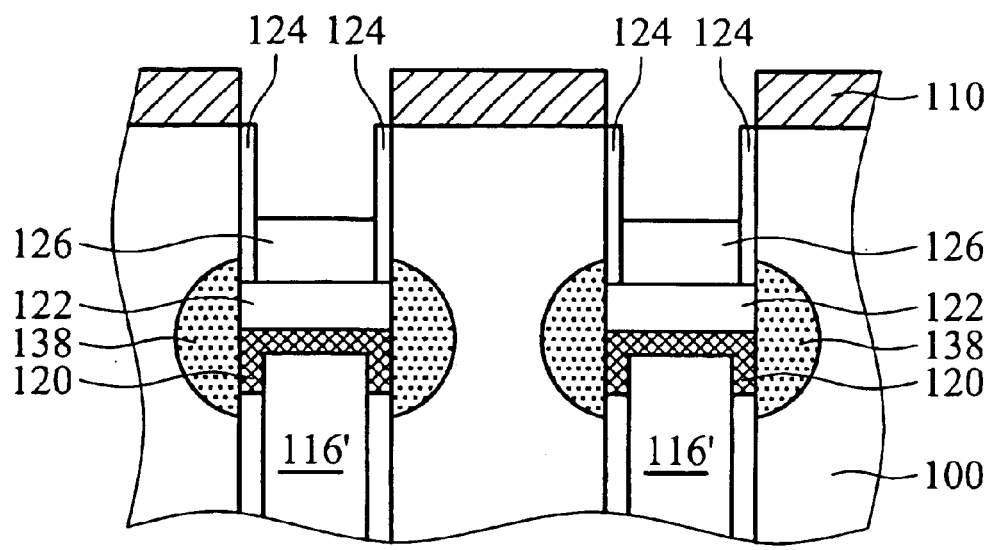
Figure 1H:
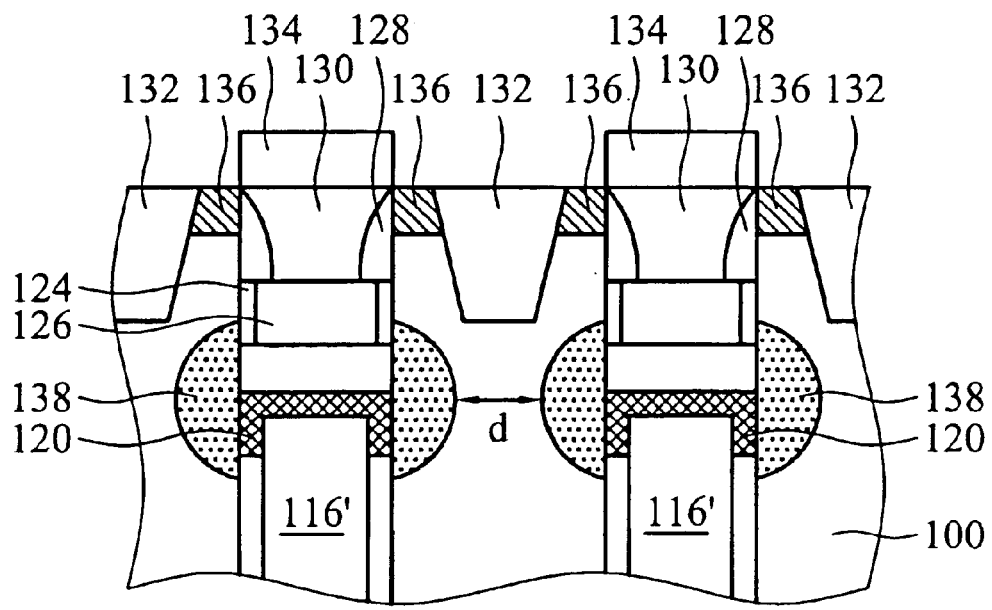
Figure 2A:
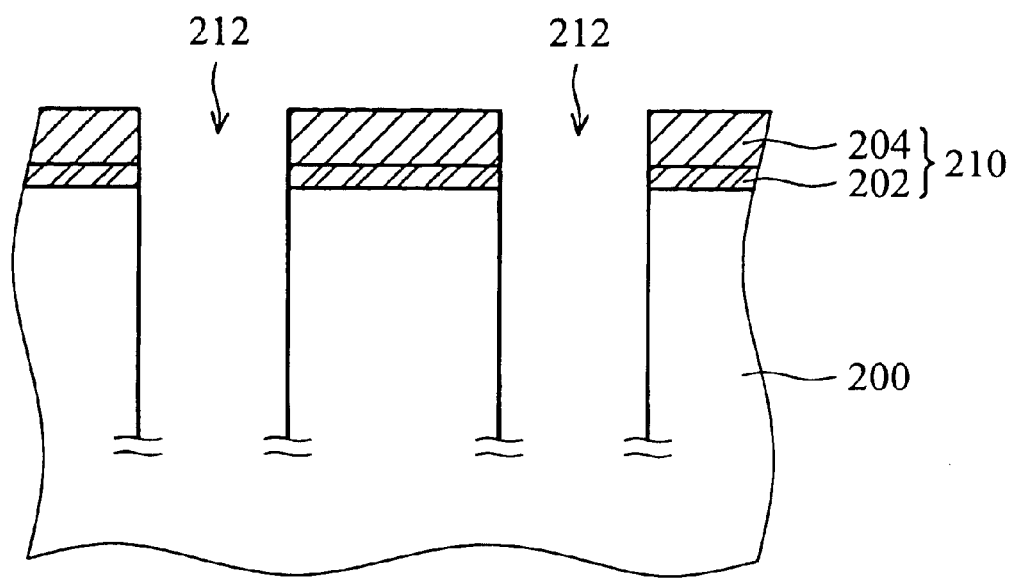
FIGS. 2A~2J are schematic sectional views showing a partially fabricated integrated circuit structure at successive stages in forming a transistor of a DRAM cell of the present invention.

In FIG. 2A, a semiconductor substrate 200 is provided. The semiconductor substrate 200 is composed of silicon or germanium. The semiconductor substrate 200 can be made by epitaxial silicon or silicon on insulator. For simplicity, a P-type semiconductor silicon substrate 200 is given as an example in this invention. A patterned pad layer 210 composed of a pad oxide layer (such as $SiO_2$) 202 and a silicon nitride layer 204 (such as $Si_3N_4$) is formed on part of the substrate 200. The pad oxide layer 202 can be formed by oxidation and the silicon nitride layer 204 can be formed by CVD (chemical vapor deposition). The thickness of the pad layer 210 is about 1500 to 3000 Å. Using the pad layer 210 as a mask, part of the substrate 200 is removed to form a deep trench 212 therein. A trench capacitor (not shown) is then formed at the lower portion of the deep trench 212 by conventional processes, as disclosed in U.S. Pat. Nos. 6,190, 988, 6,326,261, and the others. In order to avoid obscuring the aspects of the present invention, the trench capacitor process is not described here.

Figure 2B:
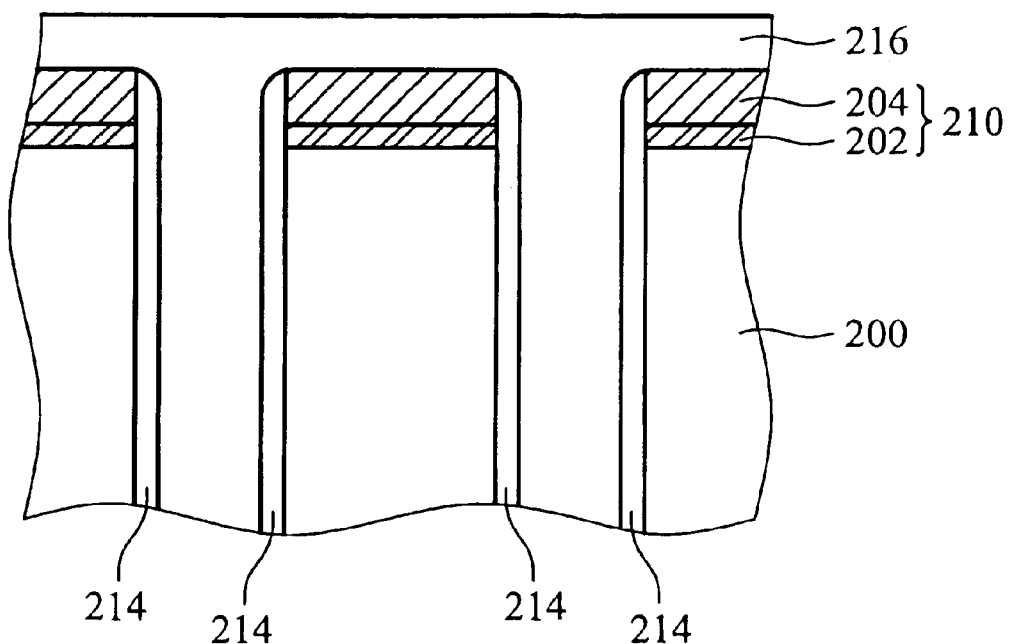

In FIG. 2B, a collar insulating layer 214 is formed on the sidewall of an upper portion of the deep trench 212 above the trench capacitor (not shown). The collar insulating layer 214 can be a silicon oxide ($SiO_2$) layer formed by CVD. The thickness of the collar insulating layer 214 is about 200 to 1000 Å. A first conductive layer 216 is formed above the trench capacitor (not shown). The first conductive layer 216 fills the inner space of the deep trench 212 and expands on the pad layer 210. The first conductive layer 216 is usually composed of polysilicon doped with arsenic ions or phosphorus ions formed by CVD.

Figure 2C:
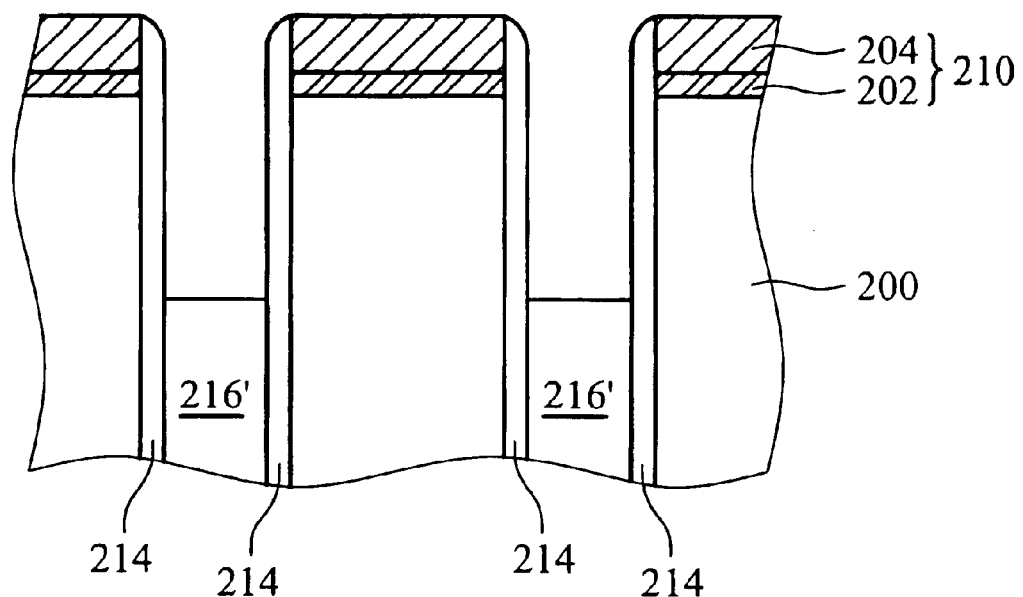

In FIG. 2C, using the pad layer 210 as a stop layer, the first conductive layer 216 above the pad layer 210 is removed by performing a planarization process, such as CMP (chemical mechanical polishing). An etch-back process is then performed to remove a portion of the first conductive layer 216 to a first determined depth, and thus a remaining first conductive layer 216' is formed. That is, the top surface of the remaining first conductive layer 216' is lower than the surface of the substrate 200. The first determined depth is about 3000~5000 Å beneath the surface of the substrate 200.

Figure 2D:
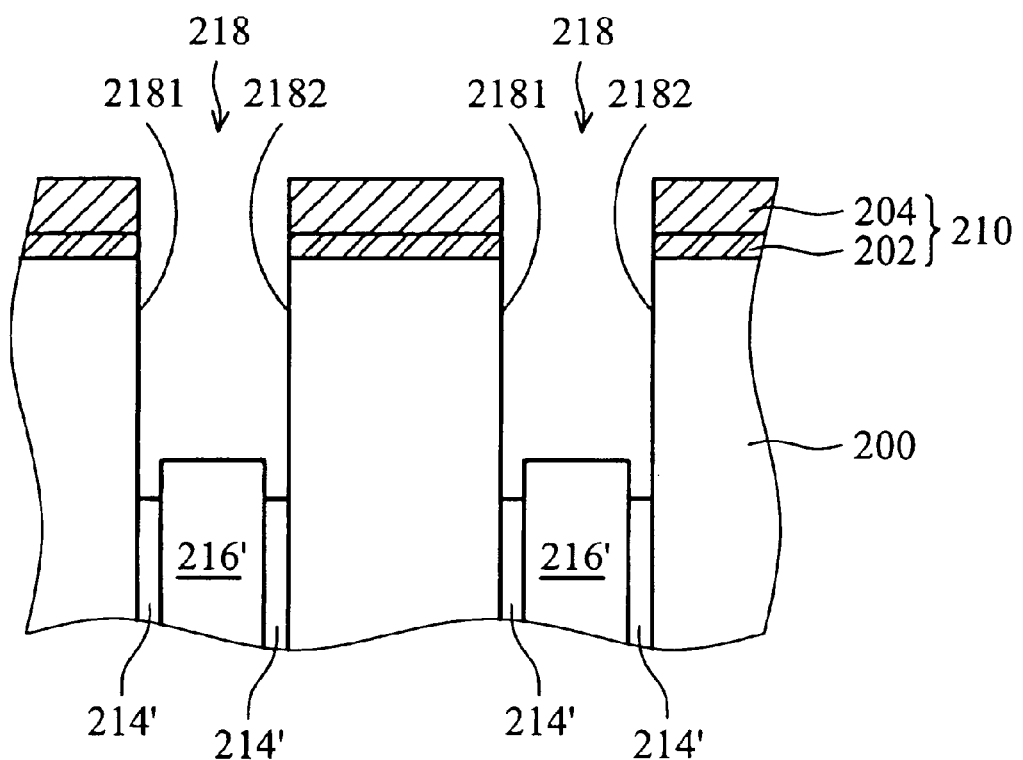

In FIG. 2D, a portion of the collar insulating layer 214 is removed to form a remaining collar insulating layer 214' in an opening 218 by over-etching process until the top surface of the remaining collar insulating layer 214' is lower than that of the remaining first conductive layer 216'. The opening 218 has a first sidewall 2181 and a second sidewall 2182.

Figure 2E:
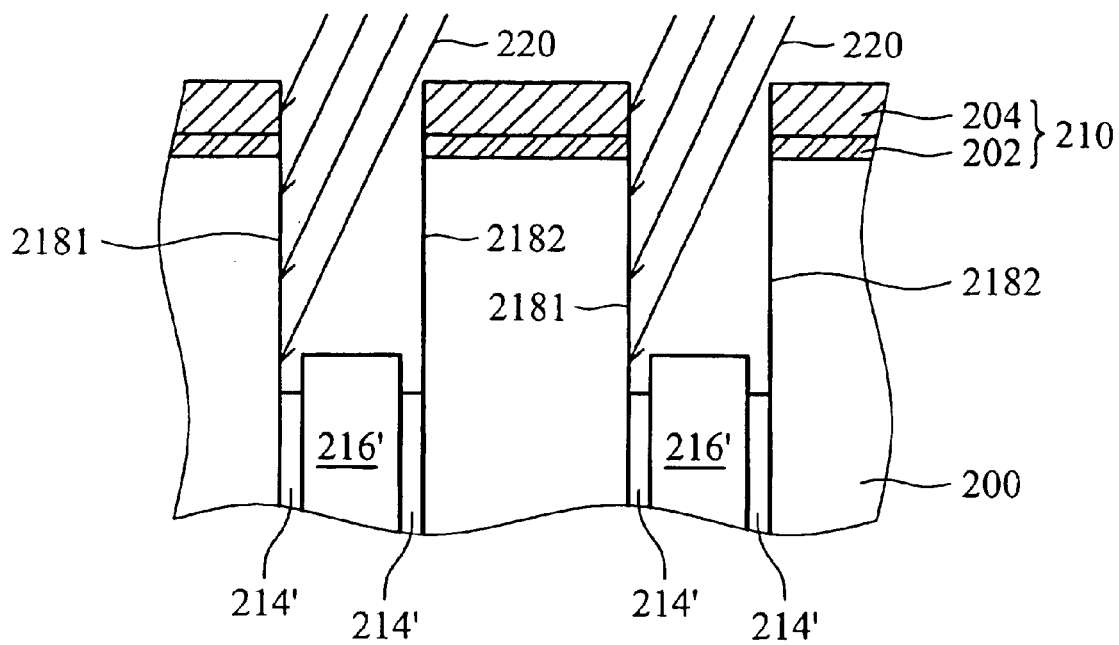

FIG. 2E shows the key step of the present invention. An angle implantation 220 with fluorine-containing ions is performed on the first sidewall 2181 of the opening 218. The fluorine-containing ions can comprise F and/or $BF_2$ ions. An operating condition of the implantation 220 is provided, but is not intended to limit the present invention. For example, the implantation energy is 15~30 keV and the ion dosage is 1E14~4.5E15 ions/$cm^2$.

Figure 2F:
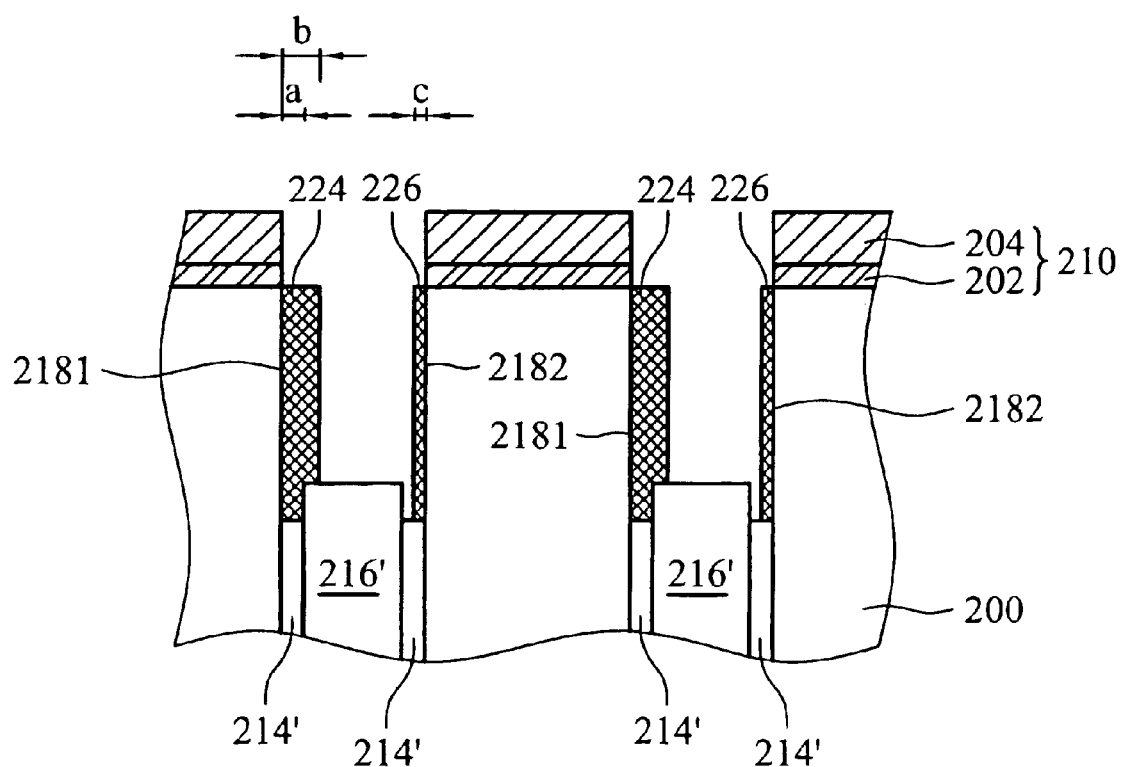

In FIG. 2F, a thermal oxidation process of 900~950° C. is performed to form a first oxide layer 224 on the first sidewall 2181 and a second oxide layer 226 on the second sidewall 2182, wherein a thickness "b" of the first oxide layer 224 is greater than a thickness "c" of the second oxide layer 226. The oxide layers 224 and 226 can be $SiO_2$ layers. It is noted that the first oxide layer 224 with thickness "b" is preferably greater than the remaining collar insulating layer 214' with thickness "a". The mechanism and experimental results of the oxide thickness of the F/$BF_2$-implanted layer being two or three times that of the un-implanted layer in a thermal oxidation process at 900~950° C., which are disclosed by Debra S. Woolsey and in the article entitled "Enhanced discrete DMOS power trench gate oxide growth" in the Journal of Solid State Technology No. 31, October 2002.

Figure 2G:
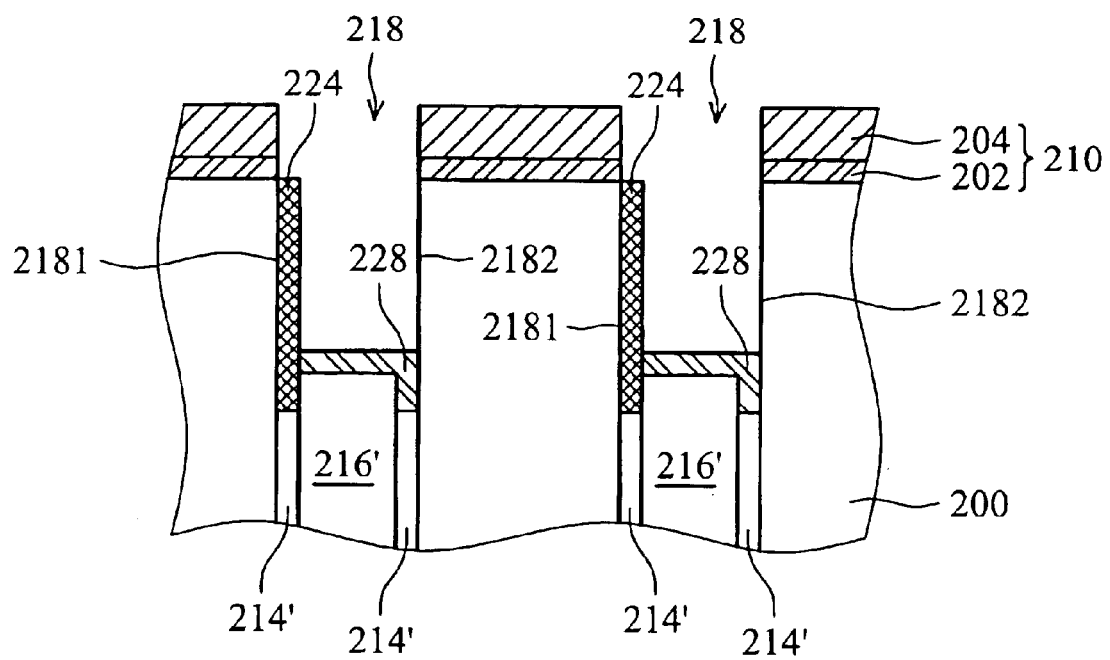

In FIG. 2G, using isotropic etching (e.g. wet etching) with time mode, the second oxide layer 226 is removed to expose the second sidewall 2182 of the opening 218. At this time, the first oxide layer 224 remains on the first sidewall 2181. It is noted that, due to the first oxide layer 224 being greater than the second oxide layer 226, a mask to protect the first oxide layer 224 during this etching step is not required.

In FIG. 2G, by performing deposition and etch-back processes, a second conductive layer 228 serving as a buried strap 228 is formed at the bottom of the opening 218, wherein the second conductive layer 228 is insulated from the first sidewall 2181 by the first oxide layer 224. The second conductive layer 228 is composed of polysilicon doped with impurities, such as arsenic ions or phosphorus ions.

Figure 2H:
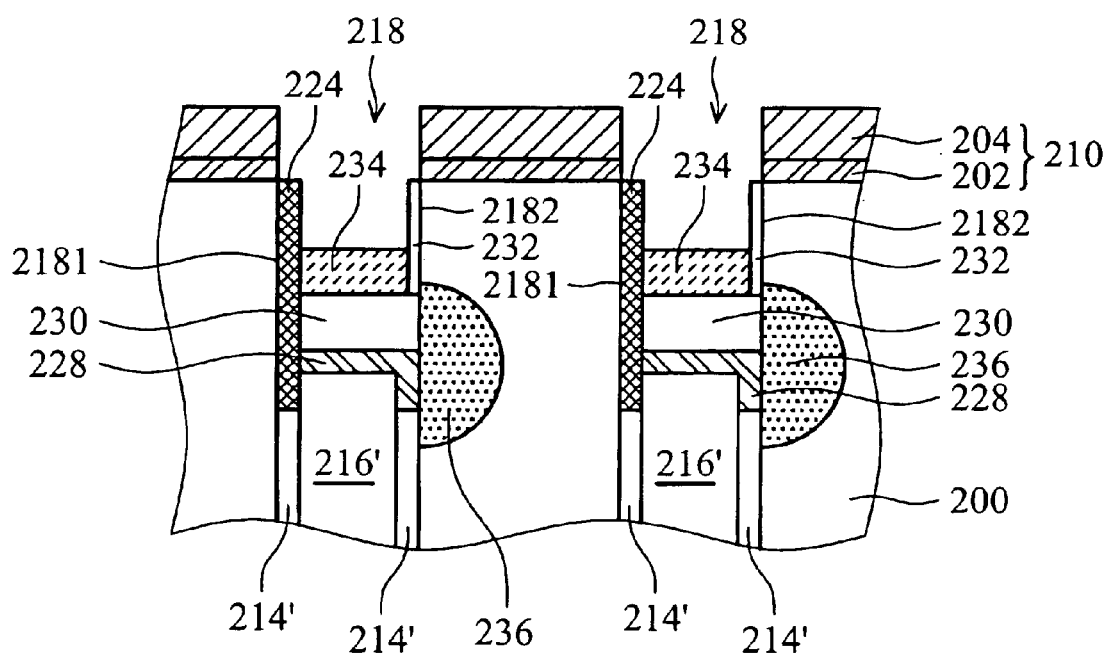

In FIG. 2H, an insulating layer 230 is formed on the second conductive layer 228. The insulating layer 230 can be a $SiO_2$ layer formed by CVD. The insulating layer 230 is commonly called a trench top oxide (TTO) layer. A gate insulating layer 232 is then formed on the second sidewall 2182 by thermal oxidation at 800~1000° C. The gate insulating layer 232 can be a $SiO_2$ layer.

In FIG. 2H, a third conductive layer 234 serving as a gate 234 is formed in part of the opening 218. The third conductive layer 234 can be composed of polysilicon doped with arsenic ions or phosphorus ions. Due to the high temperature during the mentioned and subsequent manufacturing processes, the impurities contained in the buried strap 228 (i.e. the second conductive layer) out-diffuse into the substrate 200 to form a source region 236, as show in FIGS. 2H~2J.

Figure 2I:
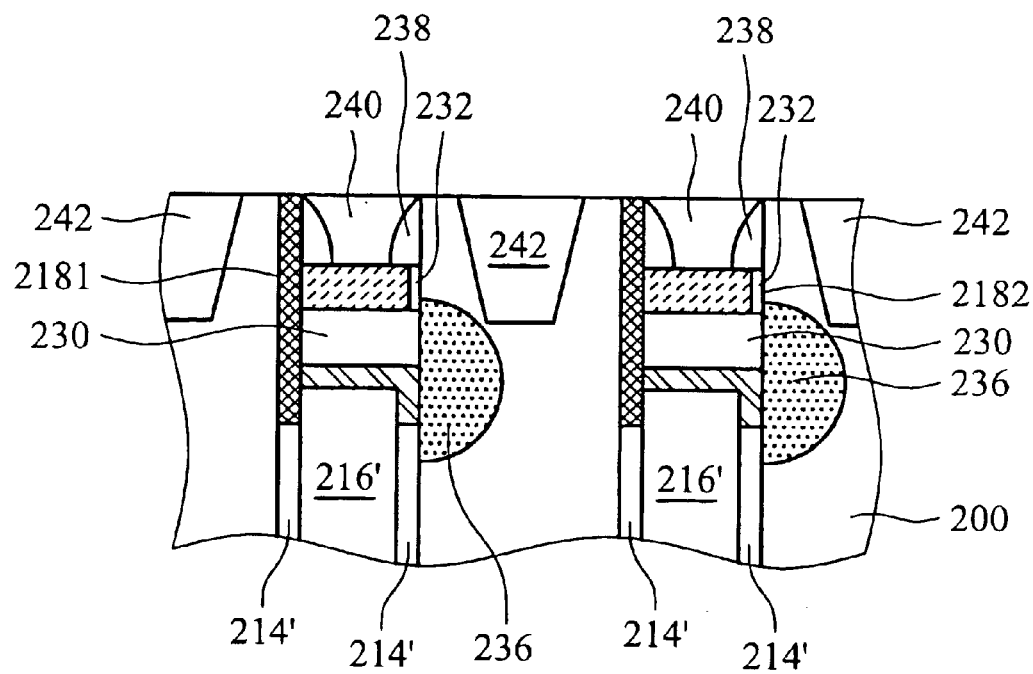

In FIG. 2I, by performing deposition and etch-back processes, an insulating spacer 238 is formed on the sidewall of the upper portion of the opening 218. The insulating spacer 238 can be a SiO$_2$ layer. Next, a fourth conductive layer 240 fills the opening 218. The pad layer 210 is removed by a planarization process such as CMP, thus a smooth substrate 200 surface is obtained. A shallow trench isolation (STI) 242 is then formed in the substrate 200 to define active areas.

Figure 2J:
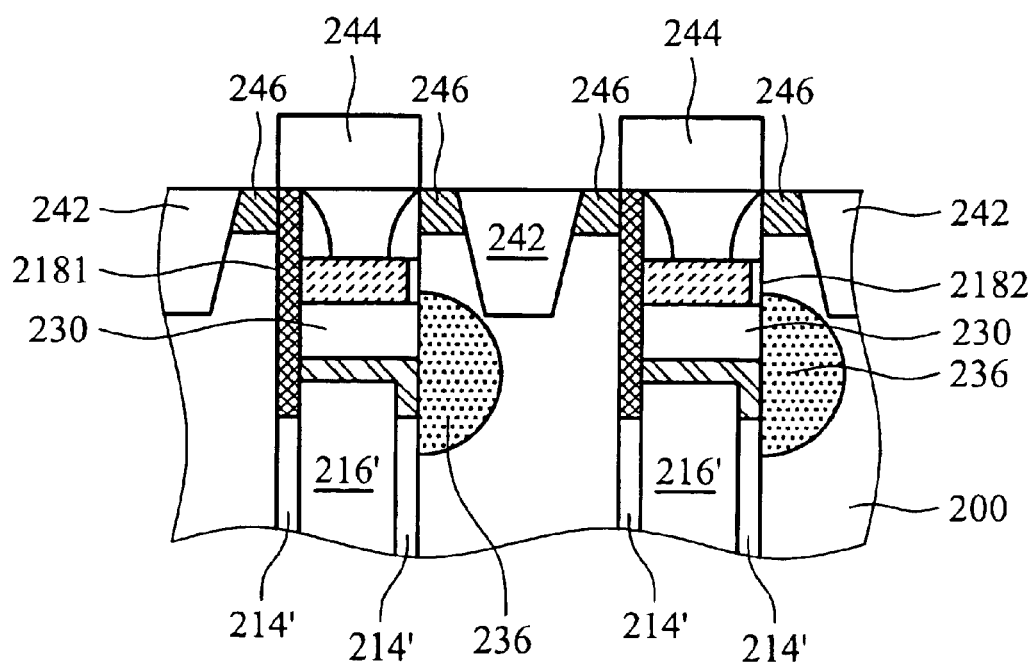

In FIG. 2J, a fifth conductive layer 244 serving as a word line 244 is formed on the fourth conductive layer 240. A drain region 246 is then formed by using the word line 244 as a mask and implanting impurities (e.g. arsenic ions or phosphorus ions) into the substrate 200.

The present invention uses the angle implantation with fluorine-containing ions and the oxidation process of 900~950° C. to form the thick first oxide layer on the first sidewall and the thin second oxide layer on the second sidewall. The second oxide layer is removed to expose the second sidewall, the first oxide layer, however, remains on the first sidewall. A single sided buried strap is then formed at the bottom of the opening. Thus, the single sided buried strap is insulated from the first sidewall by the first oxide layer, thereby preventing leakage between adjacent source regions. In addition, the present invention is well suited to the 0.11 μm (or below) trench technology, thereby achieving the goal of reduced IC size and ameliorating the disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a memory cell with a single sided buried strap, comprising the steps of:
   providing a substrate having a trench;
   forming a trench capacitor at a lower portion of the trench;
   forming a collar insulating layer on a sidewall of an upper portion of the trench;
   forming a first conductive layer above the trench capacitor and filling the trench;
   removing part of the first conductive layer and part of the collar insulating layer to form a remaining first conductive layer and a remaining collar insulating layer in an opening, wherein the opening has a first sidewall and a second sidewall, and a top surface of the remaining collar insulating layer is lower than that of the remaining first conductive layer;
   performing an angle implantation with fluorine-containing ions on the first sidewall of the opening;
   performing a thermal oxidation process to form a first oxide layer on the first sidewall and a second oxide layer on the second sidewall, wherein a thickness of the first oxide layer is greater than that of the second oxide layer;
   removing the second oxide layer to expose the second sidewall; and
   forming a second conductive layer serving as a buried strap at a bottom of the opening, wherein the second conductive layer is insulated from the first sidewall by the first oxide layer.

2. The method according to claim 1, further comprising the steps of:
   forming an insulating layer on the second conductive layer;
   forming a gate insulating layer on the second sidewall;
   forming a gate in the opening; and
   forming a source region and a drain region in the substrate.

3. The method according to claim 1, wherein the formation of the trench comprises the steps of:
   forming a patterned pad layer on the substrate; and
   using the pad layer as a mask, removing part of the substrate to form a trench in the substrate.

4. The method according to claim 1, wherein the substrate is a silicon substrate.

5. The method according to claim 3, wherein the pad layer comprises an oxide pad layer and a nitride layer.

6. The method according to claim 1, wherein the collar insulating layer is a SiO$_2$ layer.

7. The method according to claim 1, wherein the first conductive layer is a doped polysilicon layer.

8. The method according to claim 1, wherein the fluorine-containing ions comprise F and/or BF$_2$ ions.

9. The method according to claim 1, wherein an implantation energy of the angle implantation is 15~30 keV.

10. The method according to claim 9, wherein a dosage of the angle implantation is 1E14~4.5E15 ions/cm$^2$.

11. The method according to claim 1, wherein an operating temperature of the thermal oxidation process is 900~950° C.

12. The method according to claim 1, wherein the second conductive layer is a doped polysilicon layer.

13. The method according to claim 2, wherein the gate insulating layer is a SiO$_2$ layer formed by thermal oxidation.

14. The method according to claim 13, wherein an operating temperature of the thermal oxidation process is 800~1000° C.

15. A method of forming a memory cell with a single sided buried strap, comprising the steps of:
   providing a substrate;
   forming a patterned pad layer on the substrate;
   using the pad layer as a mask, removing part of the substrate to form a trench therein;
   forming a trench capacitor at a lower portion of the trench;
   forming a collar insulating layer on a sidewall of an upper portion of the trench;
   forming a first conductive layer above the trench capacitor and filling the trench;
   removing part of the first conductive layer to a determined depth, thus forming a remaining first conductive layer;
   removing part of the collar insulating layer to form a remaining collar insulating layer in an opening, wherein the opening has a first sidewall and a second sidewall, and a top surface of the remaining collar insulating layer is lower than that of the remaining first conductive layer;
   performing an angle implantation with fluorine-containing ions on the first sidewall of the opening;
   performing a thermal oxidation process to form a first oxide layer on the first sidewall and a second oxide layer on the second sidewall, wherein a thickness of the first oxide layer is greater than that of the second oxide layer;
   removing the second oxide layer to expose the second sidewall; and forming a second conductive layer serving as a buried strap at a bottom of the opening, wherein the second conductive layer is insulated from the first sidewall by the first oxide layer;

forming an insulating layer on the second conductive layer;

forming a gate insulating layer on the second sidewall;

forming a third conductive layer serving as a gate in part of the opening;

forming an insulating spacer on the sidewall of the opening;

forming a fourth conductive layer to fill the opening;

forming a fifth conductive layer on the fourth conductive layer; and forming a source region and a drain region in the substrate.

16. The method according to claim 15, wherein the substrate is a silicon substrate.

17. The method according to claim 15, wherein the fluorine-containing ions comprise F and/or $BF_2$ ions.

18. The method according to claim 15, wherein an implantation energy of the angle implantation is 15~30 keV and a dosage of the angle implantation is 1E14~4.5E15 ions/$cm^2$.

19. The method according to claim 15, wherein an operating temperature of the thermal oxidation process is 900~950° C.

20. The method according to claim 15, wherein the gate insulating layer is a $SiO_2$ layer formed by thermal oxidation.

* * * * *